United States Patent [19]
Sturdivant et al.

[11] Patent Number: 5,552,752
[45] Date of Patent: Sep. 3, 1996

[54] MICROWAVE VERTICAL INTERCONNECT THROUGH CIRCUIT WITH COMPRESSIBLE CONDUCTOR

[75] Inventors: Rick L. Sturdivant, La Mirada; Clifton Quan, Arcadia, both of Calif.

[73] Assignee: Hughes Aircraft Company, Los Angeles, Calif.

[21] Appl. No.: 458,839

[22] Filed: Jun. 2, 1995

[51] Int. Cl.$^6$ ............................... H01P 3/02; H01P 1/04; H01P 5/00
[52] U.S. Cl. .................... 333/243; 174/128.1; 333/246; 333/260
[58] Field of Search .................... 333/243, 244, 333/246, 260; 174/90, 128.1; 439/449, 930

[56] References Cited

U.S. PATENT DOCUMENTS

| | | | |
|---|---|---|---|
| 3,663,739 | 5/1972 | Chevrier | 333/243 X |
| 4,206,958 | 6/1980 | Hall et al. | 174/90 X |
| 4,347,487 | 8/1982 | Martin | 333/243 X |
| 4,556,265 | 12/1985 | Cunningham | 333/260 X |
| 4,641,140 | 2/1987 | Heckaman et al. | 333/243 X |
| 4,686,492 | 8/1987 | Grellmann et al. | 333/246 X |
| 5,302,923 | 4/1994 | Mason et al. | 333/260 X |

OTHER PUBLICATIONS

"Array Module Connector Test Program at Unisys," R. J. Kuntz, S. Williams, MCM '94 Proceedings, pp. 498–503.
"CIN::APSE Standard Products," Cinch Connector Division, 1992.
"A Modified PTFE Microwave Circuit Substrate," R. J. Bonfield, MSN & Communications Technology, Feb. 1988.

*Primary Examiner*—Paul Gensler
*Attorney, Agent, or Firm*—Leonard A. Alkov; Wanda K. Denson-Low

[57] ABSTRACT

A microwave frequency transmission line provides the capability of solderless interconnections between stacked microwave hybrid and printed wiring board (PWB) assemblies. A wire-like transmission line is embedded in a dielectric and placed in an open square trough. A compressible center conductor is realized by densely packing thin wire into an opening in the supporting dielectric to form the compressible center conductor. A vertical right angle bend transition uses the transmission line to interconnect between grounded coplanar waveguide (CPWG) transmission lines. This orthogonal transition uses button spring contacts, thus creating a reusable solderless vertical interconnection between the two transmission lines. This transition can operate from DC to greater than 15 GHz with good match and low loss, and allows a transition from a CPWG transmission line on a first substrate to another CPWG transmission line on a second substrate stacked above the first substrate.

18 Claims, 3 Drawing Sheets

MICROWAVE VERTICAL INTERCONNECT THROUGH CIRCUIT WITH COMPRESSIBLE CONDUCTOR

TECHNICAL FIELD OF THE INVENTION

This invention relates to RF interconnection devices, and more particularly to a flexible RF transmission line and to vertical grounded coplanar waveguide H-bend interconnections utilizing this transmission line.

BACKGROUND OF THE INVENTION

There is a need in many microwave applications for providing RF interconnections between adjacent circuit boards. Conventional techniques for interconnecting circuit boards include the use of cables. The disadvantage to these methods are size, weight, and cost.

This invention offers a new, compact approach to microwave packaging. Separate, individual hybrids can now be packaged vertically, saving valuable real estate. Other techniques for providing vertical bends in interconnections require several process steps and a more permanent attachment such as epoxies and solders. Conventional transitions between a coplanar waveguide (CPWG) and a 3-wire line may have side effects of exciting additional, undesirable modes in a circuit.

This invention provides the capability to create low cost, easy to assemble and easy to repair multi-layered stacked microwave hybrid assemblies. Other transmission interconnects require a more permanent attachment such as solders and epoxies and have narrower operating frequency bandwidth.

SUMMARY OF THE INVENTION

One aspect of the invention is a new type of "fuzzax" microwave transmission line, comprising an electrically conductive trough member defining a trough, a dielectric filler element disposed within trough and having formed therein an opening extending from a first end of the trough to a second end of the trough. A center conductor is disposed within the opening, and includes a first compressible conductor member formed of thin metal wire densely packed within the opening. The compressible conductor member includes a first end protruding from the opening at the first trough end by a contact dimension to form a first compressible contact. The transmission line can be used to make a vertical interconnection circuit for making microwave connections to CPWG transmission lines without the need for solder connections.

In one embodiment, the center conductor is defined by the compressible member, which extends through the opening from the first trough end to the second trough end, the compressible member protruding from the second trough end to define a second compressible contact.

In a second embodiment, the center conductor further includes a rigid conductor member disposed within the opening to define a dielectric-filled trough transmission line portion. The rigid conductor member has a first end in a compression fit with the first end of the compressible element. The rigid conductor member can be a solid metal wire conductor, or a hollow tube with conductive surfaces. The center conductor can further include a second compressible conductor member including a first end protruding from the opening at the second trough end by a contact dimension to form a second compressible contact. A second end of the second compressible member is in a compression fit against a second end of the solid metal wire or tube conductor in electrical contact therewith.

According to another aspect of the invention, a stacked assembly of microwave circuits formed on substrates is described. The assembly includes a first microwave circuit comprising a first substrate having defined on a first substrate surface a first grounded coplanar waveguide (CPWG) transmission line, a second microwave circuit comprising a second substrate having defined on a second substrate surface a second CPWG transmission line, and an interconnection circuit for providing an orthogonal microwave transition between the first and second CPWG transmission lines. The interconnection circuit includes a fuzzax transmission line, with the center conductor including a first compressible conductor member including a first end protruding from the opening at the first trough end by a contact dimension to form a first compressible contact, and a second compressible conductor member including a first end protruding from the opening at the second trough end by a contact dimension to form a second compressible contact. The first and second substrates sandwich the interconnection circuit so that the first trough surface is in compressive electrical contact with ground plane surfaces of the first CPWG line without contacting a center conductor, and the second trough surface is in compressive electrical contact with ground plane surfaces of the second CPWG line without contacting a center conductor. The first compressible contact is in compressive electrical contact with the center conductor of the first CPWG line and the second compressible contact is in compressive electrical contact with the center conductor of the second CPWG line.

BRIEF DESCRIPTION OF THE DRAWING

These and other features and advantages of the present invention will become more apparent from the following detailed description of an exemplary embodiment thereof, as illustrated in the accompanying drawings, in which:

FIG. 1b is a side cross-sectional view of the transmission line of FIG. 1a, taken along line 1b—1b of FIG. 1a.

FIG. 2b is a side cross-sectional view of the transmission line of FIG. 2a, taken along line 2b—2b of FIG. 2a.

FIG. 3b is a side cross-sectional view of the transmission line of FIG. 3a, taken along line 3b—3b of FIG. 3a.

DETAILED DESCRIPTION OF THE PREFERRED EMBODIMENT

One aspect of this invention is a new type of microwave frequency transmission line, sometimes referred to herein as "fuzzax" transmission line, that provides the capability of solder-less interconnections between stacked microwave hybrid and printed wiring board (PWB) assemblies. Fuzzax is a wire-like transmission line embedded in a dielectric and placed in an open square trough. Fuzzax transmission line is similar to dielectric filled trough line except that fuzzax uses a compressible center conductor instead of a solid metal center conductor. This center conductor is realized by densely packing thin wire into the hole in the supporting dielectric to form the compressible center conductor.

Figure 1A:
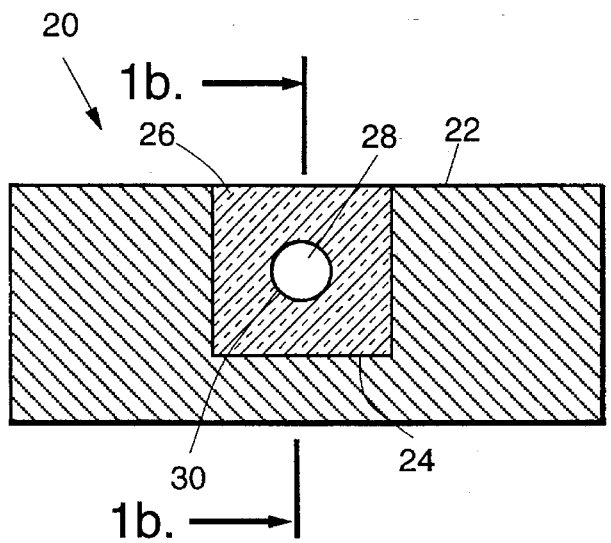
FIG. 1a is an end cross-sectional view taken of a "fuzzax" transmission line embodying one aspect of this invention.
Figure 1B:
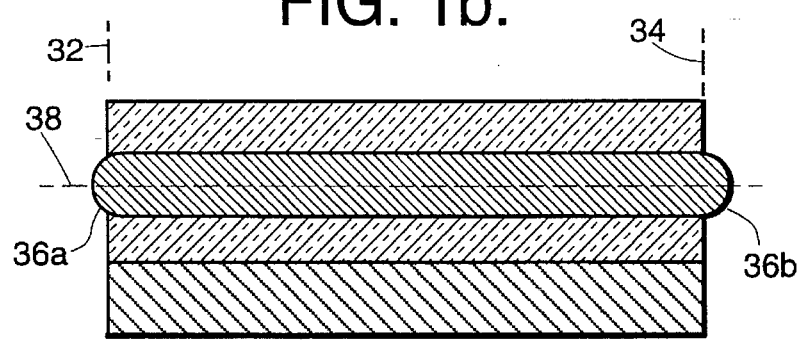
Figure 1C:
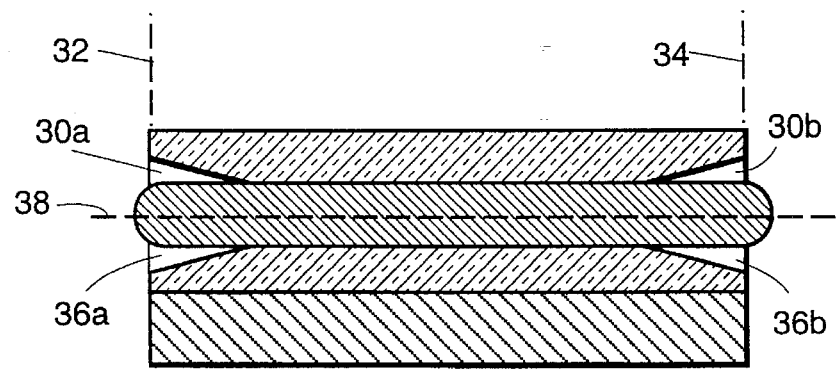
FIG. 1c is a view similar to FIG. 1b but illustrating in exaggerated form the slight taper at the edges of the opening in the dielectric.

FIGS. 1a–1c illustrate the new transmission line 20. FIG. 1a is a cross-sectional end view of the line 20, and FIG. 1b is a cross-sectional side view of the line. The line 20 includes a metal outer conductor shield 22 defining a flat bottom trough 24, a support dielectric 26 filling the trough, and a center conductor 28. The support dielectric 24 has an opening 30 formed therein to receive the center conductor 26. In accordance with the invention, the center conductor 26 is a compressible mass of thin wire densely packed into the opening 30, which extends a short distance from the end edges at 32 and 34 of the shield 22 and dielectric 26 to form compressible, springy button contacts 36a and 36b. An exemplary range of this distance is 3–10 mils. These button contacts can then be employed to make electrical contact with conductor lines extending at right angles to the axis 38 of the transmission line 20, or to make contact with another collinear section of transmission line, for example. The electrical connections are low loss connections at microwave frequencies.

The dielectric material for the support dielectric 26, opening (width) and height dimensions of the trough 24, diameter of the center conductor 28 and the position of the center conductor within the trough 24 relative to the trough sides can be selected to provide a desired characteristic impedance for the fuzzax transmission line 50. For example, many applications will find it useful to select these parameters to realize a 50 ohm characteristic impedance.

The opening 30 formed in the dielectric 26 preferably has a slight taper formed therein at the edges of the trough member, in order to provide some open volume into which the mass of the compressible center conductor 28 can be compressed as the contact 36a or 36b is urged into contact with a rigid surface. FIG. 1c illustrates this feature in an exaggerated form, wherein the ends 30A and 30B of the opening 30 are tapered to a slightly enlarged diameter at the edges 32 and 34. In practice, the diameter of the opening ends 30a and 30b may be about 5% larger than the diameter of the compressible center conductor 28.

The outer shielding 22 can be realized using either machined metal or plated metal on dielectric.

Figure 2A:
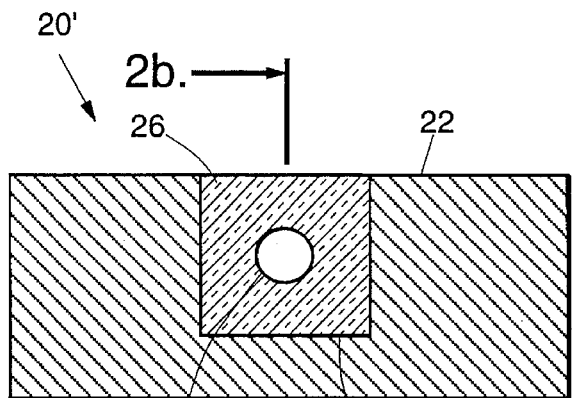
FIG. 2a is an end cross-sectional view of a transmission line comprising a combination of a fuzzax and trough line transmission line.
Figure 2B:
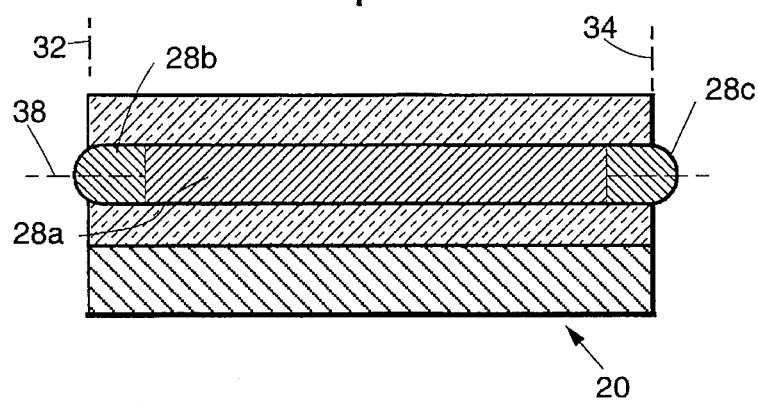

When embedded in a common trough, 50 ohm fuzzax transmission line can easily transition into 50 ohm dielectric filled trough line through end-to-end compression contact of the contact button to the solid wire center conductor. This transition is illustrated in FIGS. 2a and 2b as transmission line 20'. This line 20' is identical to line 20 of FIG. 1, except that the center conductor includes a solid conductor portion 28a and two compressible portions 28b and 28c. The compressible portions are formed of thin metal wire densely packed into the opening 30 formed in the dielectric 26, in the same manner as the compressible conductor 28 of the transmission line 20 of FIG. 1. The compressible portions 28b and 28c are in direct electrical contact with respective ends of the solid conductor portion 28a.

Figure 3A:
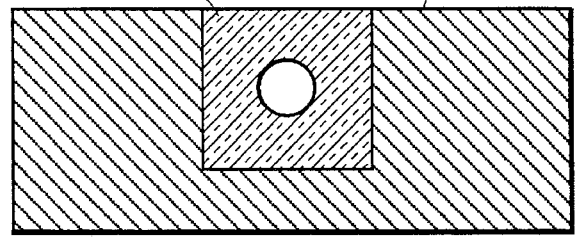
FIG. 3a is an end cross-sectional view of an alternative embodiment of a transmission line comprising a combination of a fuzzax and trough line transmission line.
Figure 3B:
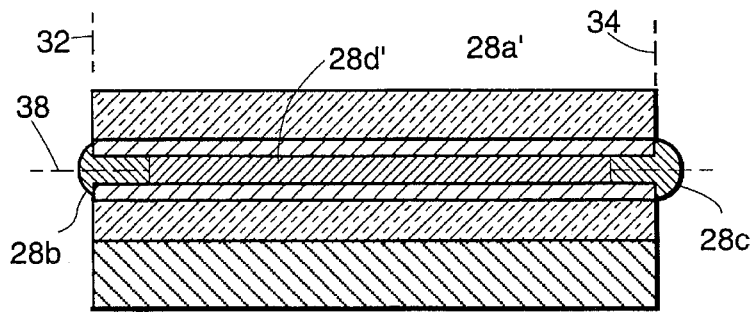

FIGS. 3a and 3b illustrate a low cost alternative embodiment of a fuzzax and trough line combination transmission line 20". This embodiment is identical to the transmission line 20' of FIGS. 2a and 2b, except that the solid center conductor portion 28a is replaced with a hollow metal plated plastic tube 28a' which extends the length of the transmission line 20". The compressible center conductor portions 28b' and 28c' are packed within the ends of the hollow opening 28d' defined by the tube 28a', and extend from the ends 32 and 34 of the transmission line 20'.

One application for this invention is to carry RF signals between vertically stacked modules, via a low loss, space efficient, low cost vertical transition. Because of the solderless nature of this invention, stacked microwave hybrids and PWB assemblies that are easy to assemble and disassemble for rework can be realized. Exemplary applications include vertical interconnects between stacked substrates, which can be found in receiver/exciters, communication subsystems, satellites, microwave automobile electronics, missile systems, other applications where size minimization is important, such as cellular telephones.

Another aspect of this invention is a vertical right angle bend transition using the fuzzax transmission line to interconnect between grounded coplanar waveguide (CPWG) transmission lines. This orthogonal transition uses fuzzax button spring contacts, thus creating a reusable solder-less vertical interconnection between the two horizontally oriented transmission lines. This transition can operate from DC to greater than 15 GHz with good match and low loss, and allows a transition from a CPWG transmission line on a first substrate to another CPWG transmission line on a second substrate stacked above the first substrate. This aspect of the invention can be extended to stacked multilayer microwave hybrid assemblies, where the fuzzax transmission line can be employed to provide solder-less vertical interconnects.

Figure 4:
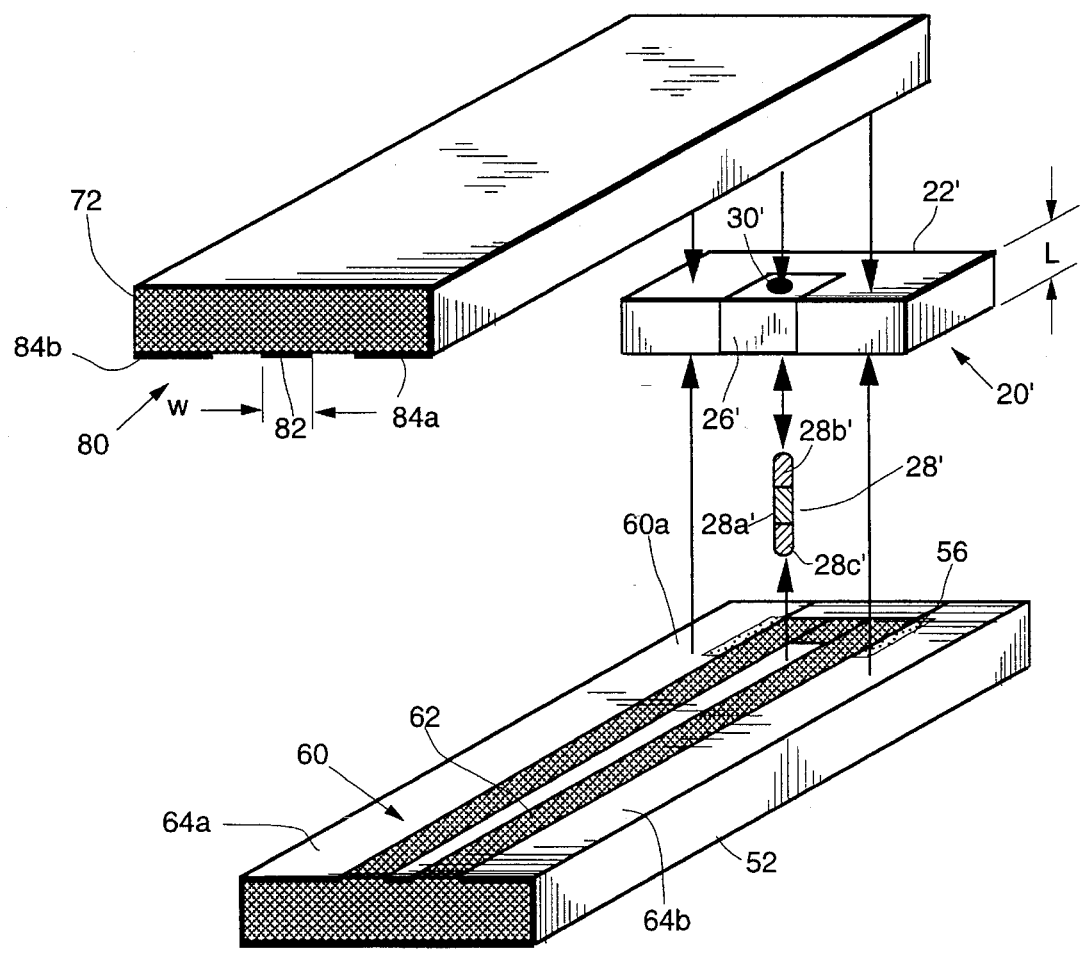
FIG. 4 is an exploded view of how the invention is used in a vertical right angle transition to provide connection between two substrates.

FIG. 4 is an exploded view of how the invention is used to provide connection between two CPWG transmission lines 60 and 80 on adjacent substrates 52 and 72. The substrates are fabricated of a dielectric material, and have formed on the facing surfaces thereof conductor patterns defining the respective CPWG lines. Thus, CPWG line 60 includes center conductor 62 disposed between and spaced from the ground planes 64a and 64b. CPWG line 80 includes center conductor 82 disposed between and spaced from the ground planes 84a and 84b.

A fuzzax interconnection circuit 20' provides a means for RF interconnection between the two CPWG lines 60 and 80. This interconnection circuit is identical to the circuit shown in FIGS. 2a and 2b, except that the dimension of the metal outer shield in the direction of the center conductor axis is shortened. This dimension L of the interconnection circuit 20' establishes the spacing between the substrates 52 and 72 when fully assembled together.

In a preferred embodiment, the interconnection circuit 20' is a combination of 50 ohm fuzzax transmission line and 50 ohm dielectric filled trough line. The diameter of the fuzzax center conductor portions 28b' and 28c' is slightly smaller than the width W of the CPWG center strip. For example, in an exemplary embodiment, the diameter of the fuzzax center conductor is 20 mils, and the CPWG center conductor strip width is 26 mils. The interconnection circuit 20' is placed over an end 60a of the CPWG 60 such that the compressible center conductor portion 28c' makes DC compression contact to the center conductor 62 of the CPWG line 60. When the two substrates 52 and 72 are brought against the interconnection circuit, the compressible center conductor portion 28b' makes DC compression contact to the center conductor 82 of the CPWG line 80. The metal trough shield 22' is designed to also make DC contact to the two outer ground plane strips 64a, 64b and 84a, 84b of the two CPWG lines 60 and 80. To ensure a good 50 ohm match at the vertical junction, the CPWG line, lying under the fuzzax line dielectric 26', is modified for a higher impedance. This impedance modification can be achieved by increasing the gap distance between the CPWG center conductor strip and the adjacent ground plane conductors. This is illustrated in FIG. 4 at region 56. The higher CPWG impedance line introduces an inductance to cancel out the parasitic capacitance formed at the junction between the CPWG line and the fuzzax line, and particularly by the capacitive loading caused by the dielectric 26'. When integrated with the support structure provided by the trough member 22', the transition requires only DC contact without any additional processes or materials such as solders or epoxies.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A microwave transmission line, comprising:
   an electrically conductive trough member, said trough member defining a trough;
   a dielectric filler element disposed within said trough, said dielectric element having formed therein an opening extending from a first end of said trough to a second end of said trough; and
   a center conductor disposed within said opening, said center conductor including (i) a first compressible conductor member, said compressible conductor member formed of thin metal wire densely packed within said opening, said compressible conductor member including a first end protruding from said opening at said first trough end by a contact dimension to form a first compressible contact and (ii) a rigid conductor member disposed within said opening to define a dielectric-filled trough transmission line portion, said rigid conductor member having a first end in a compression fit with said first end of said compressible element.

2. The transmission line of claim 1 wherein said trough is characterized by a square cross-sectional configuration.

3. The transmission line of claim 1 wherein said trough is a U-shaped trough.

4. The transmission line of claim 1 wherein said center conductor is defined by said compressible member, and said compressible member extends through said opening from said first trough end to said second trough end, said compressible member protruding from said second trough end to define a second compressible contact.

5. The transmission line of claim a wherein said rigid conductor member is a solid metal wire conductor.

6. The transmission line of claim 5 wherein said center conductor further includes a second compressible conductor member, said compressible conductor member formed of thin metal wire densely packed within said opening, said second compressible conductor member including a first end protruding from said opening at said second trough end by a contact dimension to form a second compressible contact, and a second end of said second compressible member is in a compression fit against a second end of said solid metal wire conductor in electrical contact therewith.

7. The transmission line of claim 1 wherein said rigid conductor member is a hollow tube having a center tube opening and conductive surfaces.

8. The transmission line of claim 7 wherein said tube extends through said opening from said first trough end to said second trough end, and wherein said second end of said compressible member is inserted within a first end of said tube.

9. The transmission line of claim 8 wherein said center conductor further includes a second compressible conductor member, said compressible conductor member formed of thin metal wire densely packed within said opening, said second compressible conductor member including a first end protruding from said opening at said second trough end by a contact dimension to form a second compressible contact, and a second end of said second compressible member is inserted within a second end of said tube in electrical contact therewith.

10. A stacked assembly of microwave circuits formed on substrates, comprising:
    a first microwave circuit comprising a first substrate having defined on a first substrate surface a first grounded coplanar waveguide (CPWG) transmission line;
    a second microwave circuit comprising a second substrate having defined on a second substrate surface a second CPWG transmission line; and
    an interconnection circuit for providing an orthogonal microwave transition between said first and second CPWG transmission lines, said interconnection circuit comprising:
      an electrically conductive trough member, said trough member defining a trough having first and second end surfaces;
      a dielectric filler element disposed within said trough, said dielectric element having formed therein an opening extending from a first end of said trough to a second end of said trough; and
      a center conductor disposed within said opening, said center conductor including a first compressible conductor member, said compressible conductor member formed of thin metal wire densely packed within said opening, said compressible conductor member including a first end protruding from said opening at said first trough end by a contact dimension to form a first compressible contact, said center conductor further including a second compressible conductor member, said second compressible conductor member formed of thin metal wire densely packed within said opening, said second compressible conductor member including a first end protruding from said opening at said second trough end by a contact dimension to form a second compressible contact;
    said first and second substrates sandwiching said interconnection circuit so that said first surface of said trough is in compressive electrical contact with ground plane surfaces comprising said first CPWG line without contacting a center conductor of said first CPWG line, said second surface of said trough is in compressive electrical contact with ground plane surfaces comprising said second CPWG line without contacting a center conductor of said second CPWG line, and so that said first compressible contact is in compressive electrical contact with said center conductor of said first CPWG line and said second compressible contact is in compressive electrical contact with said center conductor of said second CPWG line.

11. The assembly of claim 10 wherein said trough is characterized by a square cross-sectional configuration.

12. The assembly of claim 10 wherein said trough is a U-shaped trough.

13. The assembly of claim 10 wherein said center conductor is defined by said compressible member, and said compressible member extends through said opening from said first trough end to said second trough end.

14. The assembly of claim 10 wherein said center conductor further includes a rigid conductor member disposed within said opening to define a dielectric-filled trough transmission line portion, said rigid conductor member having a first end in a compression fit with said first end of said first compressible element and a second end in contact with said first end of said second compressible element.

15. The assembly of claim 14 wherein said rigid conductor member is a solid metal wire conductor.

16. The assembly of claim 14 wherein said rigid conductor member is a hollow tube having a center tube opening and conductive surfaces.

17. The assembly of claim 16 wherein said tube extends through said opening from said first trough end to second trough end, and wherein said second end of said first compressible member is inserted within a first end of said tube and said second end of said second compressible member is inserted within a second end of said tube.

18. The assembly of claim 10 wherein said first and said second substrate surfaces are planar surfaces.

* * * * *